United States Patent [19]

Tomo

[11] Patent Number: 5,981,139
[45] Date of Patent: Nov. 9, 1999

[54] PHOTOSENSITIVE COMPOSITION CONTAINING AN ALIPHATICAMINE

[75] Inventor: Yoichi Tomo, Kanagawa, Japan

[73] Assignee: Sony Corporation, Tokyo, Japan

[21] Appl. No.: 08/867,945

[22] Filed: Jun. 3, 1997

[30] Foreign Application Priority Data

Jun. 4, 1996 [JP] Japan ..................................... 8-141897

[51] Int. Cl.$^6$ ..................................................... G03F 7/039
[52] U.S. Cl. ........................................ 430/270.1; 430/170
[58] Field of Search .................................. 430/270.1, 170

[56] References Cited

U.S. PATENT DOCUMENTS 5,498,506  3/1996  Wengenroth et al. ............. 430/270.14
5,738,972  4/1998  Padmanaban et al. .............. 430/270.1

FOREIGN PATENT DOCUMENTS 0558280  9/1993  European Pat. Off. .

*Primary Examiner*—Janet Baxter
*Assistant Examiner*—Jill N. Holloman
*Attorney, Agent, or Firm*—Hill & Simpson

[57] ABSTRACT

A photosensitive composition is provided which prevents deactivation of photosensitive compounds contained therein to provide accurate photoresist pattern shapes. The photosensitive compositions include a photosensitive acid generator, a polyhydroxy-functional resin component and an aliphatic amine. In a preferred embodiment, the photosensitive compositions also may include a bridging agent. The photosensitive compositions preferably contain the aliphatic amine(s) in an amount of from about 0.01% to about 1.0% by weight, based upon the weight of the overall photosensitive composition.

19 Claims, 2 Drawing Sheets

PHOTOSENSITIVE COMPOSITION CONTAINING AN ALIPHATICAMINE

BACKGROUND OF THE INVENTION

The present invention relates to a photosensitive composition. The photosensitive composition of the present invention can be used, for example, as a photoresist in a lithography technology which is employed to produce electronic materials (semiconductor devices and the like).

For example, electronic materials in semiconductor devices and the like have been increasingly miniaturized. For example, a minimum processing size of a semiconductor integrated circuit device is now sub-half micron, i.e., within the range of less than about 0.5 $\mu$m. Consequently, a lithography technology using a laser beam as an exposure light capable of fine processing, especially a KrF eximer laser lithography technology has attracted much attention.

With respect to a lithography technology capable of fine processing, for example, a KrF eximer laser lithography technology, a composition material containing a photosensitive compound is chiefly used which is photosensitized at a wavelength of 248 nm and which successively induces a reaction by the action of a substance formed through photosensitization like a catalyst. Such a photosensitive composition material is designated, for example, a chemical amplification-type resist.

This photosensitive composition material contains mainly a photosensitive acid generator which causes a reaction upon catalytically using an acid formed through light irradiation to give a light-irradiated portion a site soluble in a developer (in the case of a positive resist) or insoluble in a developer (in the case of a negative resist).

In this case, however, an acid is formed in a small amount, and is also instable. Meanwhile, a variety of substances are present in an environmental atmosphere (air or the like) or on a substrate to be processed, and include those having properties to inhibit a performance of an acid formed. For example, basic gases (ammonia gas, basic gases considered to derive from a plasticizer of a piping resin, and the like) deactivate an acid formed. Further, substances on a substrate sometimes become a catalyst poison to inhibit a performance of an acid. Illustrative examples may include, for example, ammonia or water adsorbed on a silicon nitride insulating layer on a substrate, metallic layers such as titanium nitride or coated substrates such as boron phosphorus silicate glass (BPSG) which is a coated glass, all of which may have a deactivating effect on an acid.

As stated above, in the conventional technology, the above-mentioned photosensitive composition intends to be deactivated with a basic substance such as an amine or the like in air, a catalyst poison on a substrate to be processed, or the like. When this deactivation occurs, the desired processing cannot be achieved. For example, when this deactivation occurs on a surface of a resist, a pleat-like irregular shape called "T-top" is formed in the case of a positive resist. Schematically indicated at 1 in FIG. 1A is a T-top formed like a roof on an upper surface of a resist pattern 2 which is to have a rectangular shape. In the case of a positive resist, when the deactivation occurs in a substrate to be processed, a blind over edging is formed. Likewise, schematically indicated at 2 in FIG. 2A is a blind over edging formed on a lower circumferential portion of a resist pattern 2 which is to have a rectangular shape. In the case of a negative resist, when the deactivation occurs on a surface of a resist, top rounding schematically indicated at 4 in FIG. 1B happens. In the case of a negative resist, when the deactivation occurs on a substrate, undercutting schematically indicated at 5 in FIG. 2B happens. In FIGS. 1 and 2, 6 is a substrate.

In order to avoid the above-mentioned problems, a variety of methods have been known. In one method, an amine or a neutralized substance (salt) of an amine and an acid is added to a resist in advance to supplement an acid deactivated [J. Photopolymer Science and Technology, vol. 8, #4 (1995) 535–542].

In this case, N-methylpyrrolidone (NMP) or amine phenol is added. However, NMP is not so effective. Since amine phenol shows a slight absorbance at a wavelength of 148 nm, it is sensitively disadvantageous in the KrF eximer laser lithography technology.

SUMMARY OF THE INVENTION

It is an object of the present invention to provide, upon eliminating the problems of the above-mentioned conventional technologies, a photosensitive composition containing a photosensitive compound which can effectively solve the problem of the deactivation and form an excellent pattern irrespective of an atmosphere and a material to be processed. The present invention aims to provide a photosensitive composition which effectively acts against, for example, deactivation of a photosensitive acid generator, which is free from absorbance at an exposure wavelength and which does not adversely affect the sensitivity.

The present invention relates to a photosensitive composition containing at least one photosensitive compound, characterized in that at least one type of an aliphatic amine or an aliphatic amine salt is contained in an amount of 1% by weight or less in the form of a single substance or a mixture.

The "aliphatic amine" here referred to is an aromatic ring-free amine. In the present invention, an amount of an amine or an amine salt which is used singly, or an amount of two or more types of an amine or an amine salt is 1% by weight or less based on the overall photosensitive composition (including a binder resin and other additives when they are used). It is preferably at most 1% by weight and at least 0.01% by weight.

According to this invention, the effect provided by the use of an amine or an amine salt in the photosensitive composition containing at least one photosensitive compound can be given to any photosensitive composition. That is, when a photosensitive compound is a photosensitive acid generator, a sufficient effect could not necessarily be given. Meanwhile, an aliphatic amine or an aliphatic amine salt is sufficiently effective against the deactivation of a photosensitive compound, for example, a photosensitive acid generator (or an acid formed from the photosensitive acid generator). The prior technology could hardly be used in some photolithography. For example, it was sensitively disadvantageous in the KrF eximer laser lithography. However, the aliphatic amine or the aliphatic amine salt is free from the absorbance at a wavelength of 248 nm which was problematic in that case. Thus, the decrease in the sensitivity does not occur advantageously. Japanese Unexamined Patent Application No. 163,734/1989 describes a photosensitive composition containing an ethylenediamine compound. However, this document does not concern the irregular shape of the resist, and it only indicates that the composition is effective for preventing unnecessary color development. The technology of this document is not considered to be effective against the deactivation of a photosensitive compound, for example, a photosensitive acid generator. Further, Japanese Unexamined Patent Application No. 43,631/1994 discloses a technology that a polyglycol surfactant is incorporated into a resist for suppressing an influence of an environmental poison. Nevertheless, it does not bring forth an outstanding effect when using an aliphatic amine or an aliphatic amine salt. Still further, Japanese Unexamined Patent Application No. 196,755/1995 describes a technology that a phenol novolak resin is used as a base resin and a tertiary amine is added thereto for reaction. However, this technology is for obtaining a resist that serves either as a positive type or as a negative type, and the very effect has no bearing at all on the effect provided by the aliphatic amine or the aliphatic amine salt in the present invention.

Further, the present invention relates to a photosensitive composition containing at least one photosensitive compound, this photosensitive composition comprising at least one photosensitive acid generator as a photosensitive compound, at least one compound having active groups and protective groups in which at least a part of the active groups are protected with a protective group and said protective groups may be removed with an acid formed by photosensitization of the photosensitive acid generator to change the reactivity, and at least one type of an aliphatic amine or an aliphatic amine salt.

This photosensitive composition generally acts as a positive type, and it can be used as a two-component positive resist.

According to this invention, the aliphatic amine or the aliphatic amine salt is incorporated into the photosensitive acid generator as a photosensitive compound, providing a sufficient effect against the deactivation of the photosensitive acid generator (acid formed from this generator). With respect to the defect of the composition which is sensitively disadvantageous in, for example, the KrF eximer laser lithography technology, the use of the aliphatic amine or the aliphatic amine salt does not decrease the sensitivity advantageously as in the above-mentioned invention.

Still further, the present invention relates to a photosensitive composition containing at least one photosensitive compound, this photosensitive composition comprising a base resin, at least one photosensitive acid generator as a photosensitive compound, a dissolution inhibitor by which the dissolution inhibitory effect is changed with an acid formed by photosensitization of the photosensitive acid generator, and at least one type of an aliphatic amine or an aliphatic amine salt.

This photosensitive composition generally serves as a positive type, and it can be used as a three-component positive resist.

According to this invention, the deactivation of the photosensitive acid generator as a photosensitive compound can effectively be prevented. In addition, the advantages of the above-mentioned inventions can also be provided.

Furthermore, the present invention relates to a photosensitive composition containing at least one photosensitive compound, this photosensitive composition comprising at least one photosensitive acid generator as a photosensitive compound, a resin component, at least one bridging agent (for example, hexamethoxymethylmelamine) that causes a bridging reaction with an acid formed by photosensitization of the photosensitive acid generator, and at least one type of an aliphatic amine or an aliphatic amine salt.

This photosensitive composition generally serves as a negative type.

According to this invention, the deactivation of the photosensitive acid generator as a photosensitive compound can effectively be prevented. In addition, the advantages of the above-mentioned inventions can also be provided.

DETAILED DESCRIPTION OF THE INVENTION

Figure 1A:
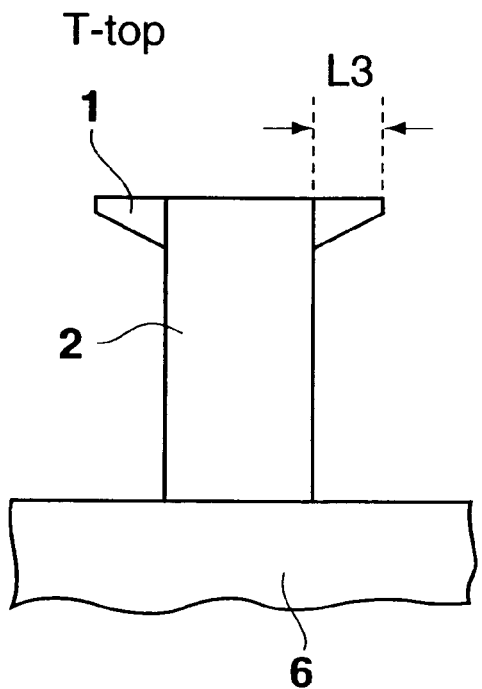
FIG. 1 is a schematic sectional view illustrating an irregular shape of a resist pattern in a positive resist.

In the present invention, there is provided the photosensitive composition containing at least one photosensitive compound contains at least one of an aliphatic amine or an aliphatic amine salt in an amount of 1% by weight or less in the form of a single substance or a mixture. The amount of 1% by weight or less can provide a necessary, satisfactory effect. It is preferably at least 0.01 and at most 1% by weight.

In the present invention, there is further provided a photosensitive composition comprising at least one photosensitive acid generator as a photosensitive compound, at least one compound having a protective group in which at least a part of an active group is protected with a protective group and the protective group is removed with an acid formed by photosensitization of the photosensitive acid generator to change the reactivity, and at least one type of an aliphatic amine or an aliphatic amine salt. Accordingly, this photosensitive composition can eliminate the problem of the deactivation of the photosensitive acid generator as a photosensitive compound. This photosensitive composition generally serves as a positive type, and it essentially contains two components, namely, the photosensitive acid generator and the compound (resin component) which is solubilized in a developer by removing the protective group through an acid formed from the photosensitive acid generator. Thus, it can be used as a two-component positive resist. In that case, at least one type of an aliphatic amine or an aliphatic amine salt is added to the two-component positive resist. This photosensitive composition can act as a so-called chemical amplification-type resist.

In the present invention, the protective group-containing compound is preferably a compound formed by protecting at least a part of a hydroxyl group of polyhydroxystyrene with a protective group.

Preferable examples of the protective group that protects at least a part of a hydroxyl group of polyhydroxystyrene include tert-BOC [protective group (1) to be illustrated later], tert-BOC—$CH_2$ (protective group (5) to be illustrated later], THP [protective group (3) to be illustrated later], i-PrOCO— [protective group (2) to be illustrated later], $(CH_3)_3$—Si— [protective group (4) to be illustrated later] and an ethylvinyl ether group.

A variety of compounds which have a photosensitivity at a desired wavelength and generate an acid can be used as a photosensitive acid generator. For example, compounds which will be illustrated later as a photosensitive acid generator can preferably be used.

In the present invention, there is still further provided a photosensitive composition comprising a base resin, at least one photosensitive acid generator as a photosensitive compound, a dissolution inhibitor by which the dissolution inhibitory effect is changed with an acid formed by photo-sensitization of the photosensitive acid generator, and at least one type of an aliphatic amine or an aliphatic amine salt. Accordingly, this photosensitive composition can eliminate the problem of the deactivation of the photosensitive acid generator as a photosensitive compound. This photosensitive composition generally serves as a positive type, and it essentially contains three components, namely, the base resin, the photosensitive acid generator and the dissolution inhibitor. Thus, it can be used as a three-component positive resist. In that case, at least one type of an aliphatic amine or an aliphatic amine salt is added to the three-component positive resist. This photosensitive composition can act as a so-called chemical amplification-type resist.

In the above-mentioned invention, at least one type of an aliphatic amine or an aliphatic amine salt is added to a three-component composition containing polyhydroxystyrene in which a part of a hydroxyl group is protected or unprotected polyhydroxystyrene, bisphenol A containing a protected hydroxyl group, cholesterol having a protected hydroxyl group or an N—O-acetal derivative [for example, an acetal derivative having a structure —(O—CH(φR)—NR—CO—O—CH$_2$—CHR)— in which R's represent alkyl groups which may be different] as a dissolution inhibitor, and a photosensitive acid generator.

In the present invention, there is furthermore provided a photosensitive composition comprising at least one photosensitive acid generator as a photosensitive compound, a resin component, at least one bridging agent [for example, hexamethoxymethylmelamine, a compound 4-2 to be illustrated later, C$_6$H$_4$(CCl$_3$)$_2$ or C$_6$H$_4$(CBr$_3$)$_2$] that causes a bridging reaction with an acid formed by photosensitization of the photosensitive acid generator, and at least one type of an aliphatic amine or an aliphatic amine salt. Accordingly, this photosensitive composition can eliminate the problem of the deactivation of the photosensitive acid generator as a photosensitive compound. This photosensitive composition generally serves as a negative type, and it can be used as a so-called chemical amplification-type resist.

When a polycyclic compound is used as an aliphatic amine or an aliphatic amine salt, a photosensitive composition having a high resistance to dry etching can be formed.

The aliphatic amine or the aliphatic amine salt used in the present invention has to be free from an aromatic ring. Preferably, it is soluble in an appropriate solvent, is not solidified through phase separation when it is developed in a resin matrix, has an appropriate melting point and is not easily evaporated.

Preferable examples of the aliphatic amine or the aliphatic amine salt which can be used in the present invention are shown below. With respect to compounds which are not indicated in the form of salts, their salts can also be used preferably.

<1> 2-aminocyclohexanol hydrochloride
<2> 2-amino-2-methyl-1,3-propanediol
<3> 2-amino-2-ethyl-1,3-propanediol
<4> 6-amino-2-ethyl-1-hexanol
<5> 2-amino-2-(hydroxymethyl)-1,3-propanediol
<6> 2-amino-2-methyl-1-propanol
<7> 3-aminonoradamantane
<7'> 3-aminonoradamantane hydrochloride
<8> 2-aminoadamantane
<9> 1-aminoadamantane
10. 2-aminonorbornene (hydrochloride)
11. 1,5-dimethylhexylamine
12. 1-(3-aminopropyl)-2-pipecoline
13. 1-(3-aminopropyl)-2-pyrrolidinone The structural formulas of these compounds are shown below.

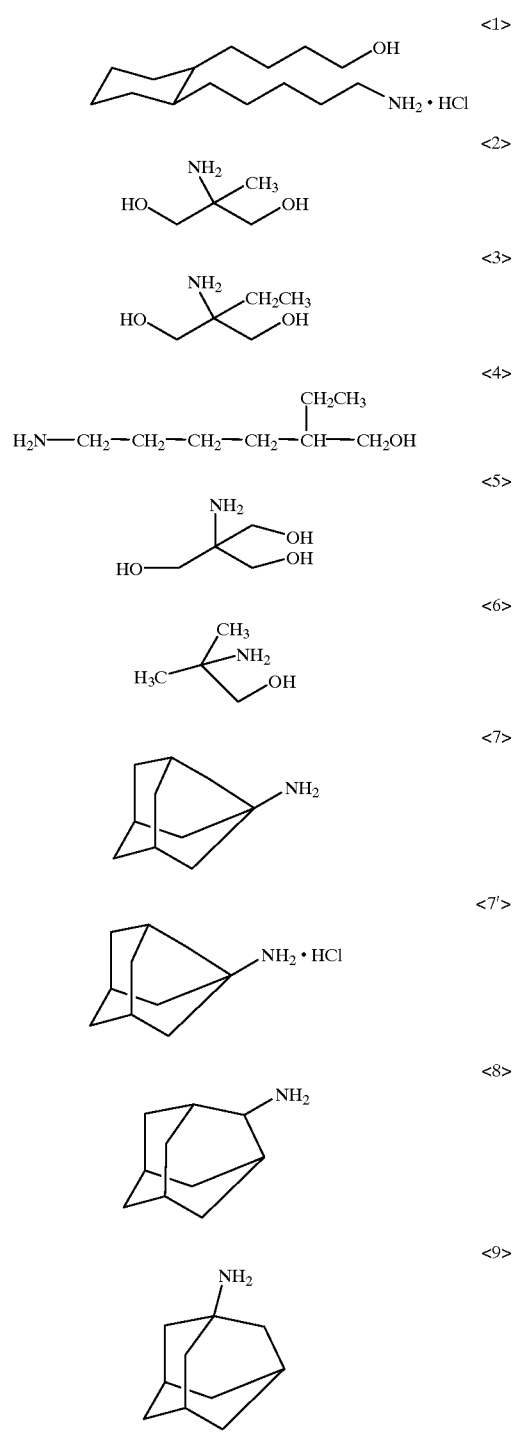

-continued

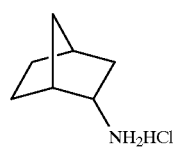

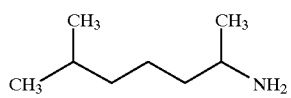

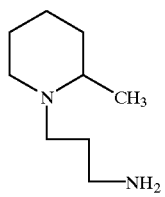

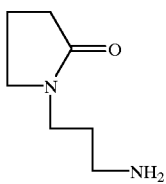

Preferable examples of the protective group which can be used in the present invention are shown below. The following protective groups are those of a hydroxyl group, for example, a phenolic hydroxyl group. Other suitable protective groups can be used depending on other groups to be protected.

(1) tert-BOC (tertiary-butylcarboxy)
(2) i-PrOC (isopropylcarboxy)
(3) THP (tetrahydropyranyl)
(4) TMS (trimethysilyl) (5) tert-BOC—CH$_2$ (tertiary-butylcarboxymethyl)

The structural formulas of these groups are shown below.

(1)

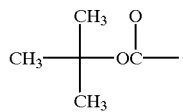

(2)

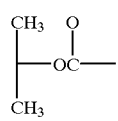

(3)

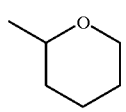

(4)

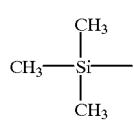

(5)

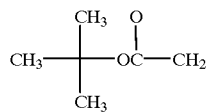

Preferable examples of the photosensitive acid generator which can be used in the present invention are shown below.

1-1 onium salt 2-1 O-nitrobenzyl ester 3-1 N-iminosulfonates 3-2 1,2-diazonaphthoquinone-4-sulfonates 3-3 α-sulfonyloxyketones 3-4 α-hydroxymethylbenzoinsulfonic acid esters 4-1 DDT derivatives 4-2 Tris-(trichloromethyl)-S-triazines 4-3 trichloroacetophenone 5-1 disulfones 5-2 bis(arylsulfonyl)diazomethanes 5-3 arylcarbonyl arylsulfonyl diazomethanes The structural formulas of the above-mentioned compounds are shown below.

1-1

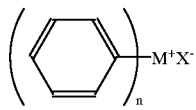

n = 2, 3 M = 1, S
X = AsF$_6$, SbF$_6$, BF$_4$, PF$_6$, CF$_3$SO$_3$, etc.

2-1

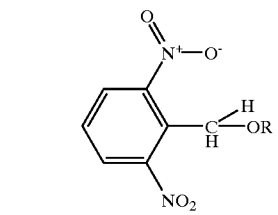

3-1

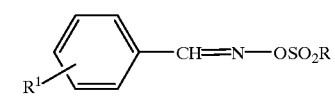

3-2

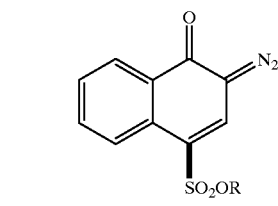

3-3

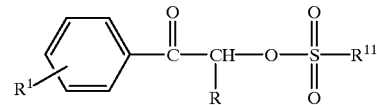

-continued 3-4
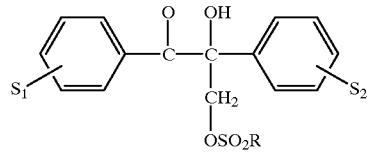

4-1
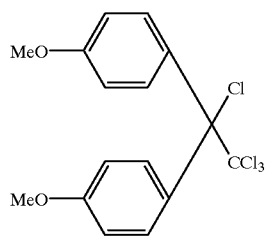

4-2
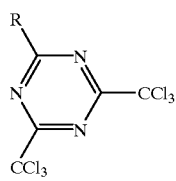

4-3
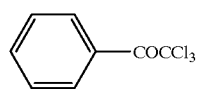

5-1
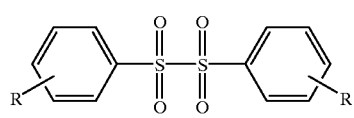

5-2
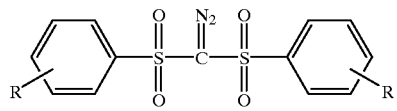

5-3
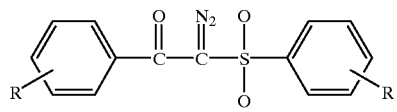

As stated above, the present invention can effectively solve the problem of the deactivation of the photosensitive comnposition containing a photosensitive compound such as a photosensitive acid generator or the like and provide a composition which is available in the formation of an excellent pattern irrespective of the atmosphere or a material to be processed. Further, the present invention can provide the photosensitive composition which is effective against the deactivation of the photosensitive acid generator, which is free from absorbance at an exposure wavelength and which does not adversely affect a sensitivity.

EXAMPLES

The present invention is illustrated more specifically by referring to the following Examples. However, the present invention is not limited thereto.

Example 1

A two-component chemical amplification-type positive resist was formed by adding 5% by weight of triphenyl phosphotrifurate (compound 1-1 with n=3 and $X=CF_3SO_3$) as a photosensitive acid generator to polyhydroxystyrene (PHS, molecular weight 10,000) in which 30% of a phenolic hydroxyl group was protected with tert-BOC [protective group (1)].

Paddle development was conducted using 2.38% by weight of trimethylammonium hydroxide (TMAH), and post-exposure baking (PEB) was conducted at 120° C. for 1 minute.

Reduced projection exposure of a reticle pattern was conducted using a KrF eximer laser beam (wavelength 248 nm). Specifically, pattern transfer exposure was conducted by means of a KrF eximer laser stepper XSR1505EX (NA=0.42, σ=0.5) using a 5:1 reticle having 0.35-micrometer line and pattern.

Figure 2A:
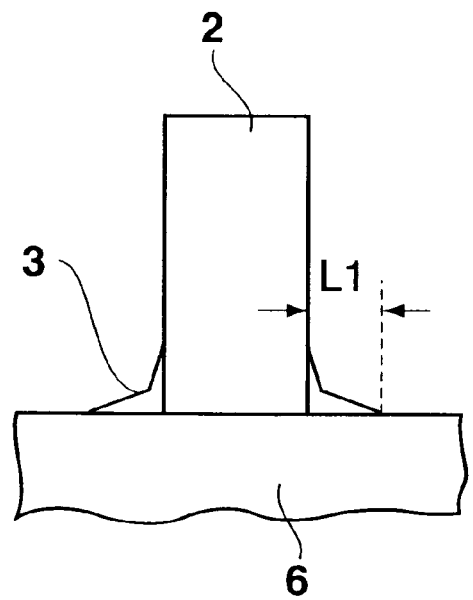
FIG. 2 is a schematic sectional view illustrating an irregular form of a resist pattern in a negative resist.
Figure 2B:
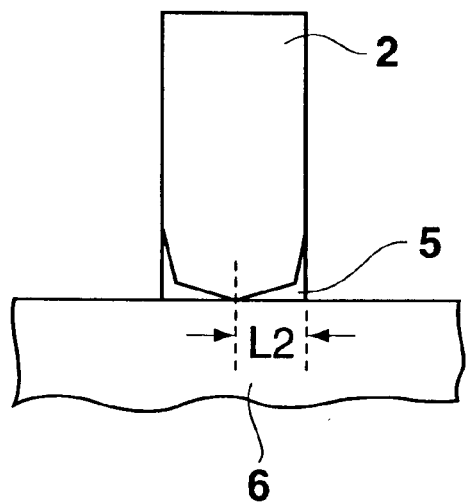

A bare silicon substrate was used for reference. A silicone substrate having a titanium nitride (TiN) film thereon was used as a substrate which was liable to cause blinding over edging or undercutting. There is a great possibility for TiN to deactivate a photosensitive acid generator (acid formed from this generator). Specifically, a silicon substrate on which a TiN film having a size of 300 Å had been laminated was used. Since the product was a positive resist, the blind over edging (which occurred on both sides) thereof was evaluated in terms of the length ($\mu$m) of the blind over edging on one side (length indicated at L1 in FIG. 2).

Figure 1B:
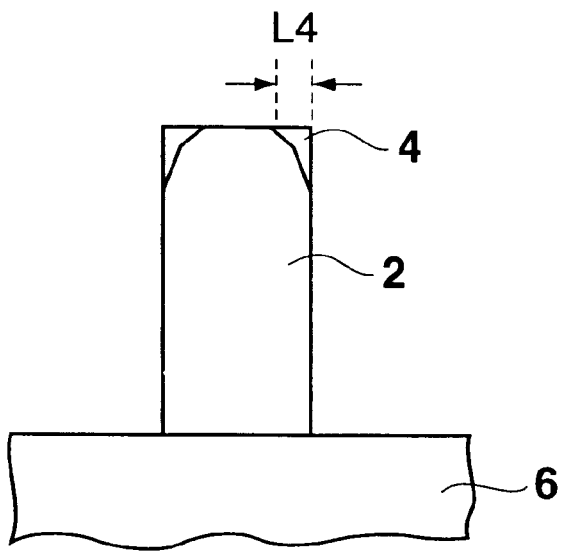

In the test for environmental atmosphere, the product was allowed to stand in a desiccator filled with hexamethyldisilazane (HMDS) for 1 minute. Since the product was a positive resist, a T-top (which occurred on both sides) thereof was evaluated in terms of the length ($\mu$m) of the T-top on one side (length indicated at L3 in FIG. 1).

The exposure and the development were conducted under the above-mentioned conditions using a resist containing an aliphatic amine or an aliphatic amine salt and a resist not containing the same (for comparison). The shapes of the resulting resists were then compared. The type of the aliphatic amine or the aliphatic amine salt (indicated with the above-mentioned number; this applies to the following description) and the results are shown in Tables 1 and 2. The amount of the aliphatic amine or the aliphatic amine salt was 0.5% by weight.

Separately, the test was conducted using 0.1% by weight of the aliphatic amine or the aliphatic amine salt, and the results were approximately the same as those provided by using 0.5% by weight thereof. However, when the amount was 0.01% by weight, the blind over edging tended to increase slightly.

TABLE 1

| Compound No. | Amount of blind over edging | Amount of dimensional change by allowing to stand in HMDS |
|---|---|---|
| <1> | 0.03 | 0.04 |
| <2> | 0.02 | 0.05 |
| <3> | 0.02 | 0.05 |
| <4> | 0.02 | 0.05 |
| <5> | 0.02 | 0.04 |
| <6> | 0.03 | 0.05 |
| <7> | 0.02 | 0.03 |
| <8> | 0.03 | 0.03 |

TABLE 2

| Compound No. | Amount of blind over edging | Amount of dimensional change by allowing to stand in HMDS |
|---|---|---|
| <9> | 0.03 | 0.03 |
| 10 | 0.03 | 0.03 |
| 11 | 0.04 | 0.05 |
| 12 | 0.04 | 0.05 |
| 13 | 0.03 | 0.05 |
| <8> + 12 | 0.03 | 0.04 |
| <4> + 12 | 0.03 | 0.04 |
| — | Bottoms are joined. | joined |

From Tables 1 and 2, it becomes apparent that when the aliphatic amine or the aliphatic amine salt was not added, the blind over edging was elongated so that the bottoms between the resist patterns were joined, and that with respect to the T-top, the roof-like irregular portions occuring on the heads of the resist patterns were joined, making it impossible to obtain a desired pattern shape. Meanwhile, according to the present invention, the irregularity of the shape such as blind over edging or undercut could be eliminated much.

In the case of using the compounds <1>, <7>, <8>, <9> and 10 as an aliphatic amine or an aliphatic amine salt, the resistance to dry etching was improved by 5% (which means that the etching speed was reduced by 5%).

The relationship between the amount of the aliphatic amine or the aliphatic amine salt and the effect was mentioned below.

When the amounts were 0.2% by weight and 0.35% by weight, approximately the same sensitivity as that given in the amount of 0.5% by weight was obtained, and the effect to prevent irregularity of the shape was also approximately the same as that provided in the amount of 0.5% by weight. When the amounts were 0.65% by weight, 0.8% by weight and 0.95% by weight, the above-mentioned effect to prevent irregularity of the shape was provided, but the sensitivity intended to be deteriorated slightly, but it was not problematic in practice. When the amount exceeded 1% by weight, the sensitivity was notably deteriorated, and it was 10 times less than that in the amount of 0.5% by weight.

According to this Example, the chemical amplification-type positive photosensitive composition having the excellent resistance to environment and the excellent substrate resistance could be provided. When the polycyclic compound was utilized, the resistance to dry etching could be improved. The use of the above-mentioned materials can omit or simplify a cleaning treatment (for example, a treatment with a filter) of an environment. The omission or simplification of the treatment of the substrate poses no problem. That is, even though such a treatment is omitted or simplified, a resist process that gives an excellent dimensional precision and does not induce abnormality in the sectional shape, such as a T-top or a blind over edging can be realized.

Example 2

A three-component chemical amplification-type positive resist was formed by adding 30% by weight of the same photosensitive acid generator as that used in Example 1 to unprotected polyhydroxystyrene (PHS, molecular weight 12,000) and adding 30% by weight of bisphenol A containing a hydroxyl group protected with tert-BOC [protective group (1)] thereto as a dissolution inhibitor.

A bare silicon substrate was used for reference as in Example 1. A silicon substrate having a titanium nitride (TiN) film thereon was used as a substrate which was liable to cause blinding over edging or undercutting. Specifically, a silicon substrate on which a TiN film having a size of 300 Å had been laminated was used. Since the product was a positive resist, the blind over edging (which occurred on both sides) thereof was evaluated in terms of the length ($\mu$m) of the blind over edging on one side (length indicated at L1 in FIG. 2).

In the test for environmental atmosphere, the product was allowed to stand in a desiccator filled with hexamethyldisilazane (HMDS) for 1 minute. Since the product was a positive resist, a T-top (which occurred on both sides) thereof was evaluated in terms of the length ($\mu$m) of the T-top on one side (length indicated at L3 in FIG. 1).

The exposure and the development were conducted under the above-mentioned conditions using the resist containing an aliphatic amine or an aliphatic amine salt and the resist not containing the same (for comparison). The shapes of the resulting resists were then compared. The type of the aliphatic amine or the aliphatic amine salt and the results are shown in Tables 3 and 4. The amount of the aliphatic amine or the aliphatic amine salt was 0.5% by weight.

Separately, the test was conducted using 0.1% by weight of the aliphatic amine or the aliphatic amine salt, and the results were approximately the same as those given by using 0.5% by weight thereof. However, when the amount was 0.01% by weight, the blind over edging intended to increase slightly.

TABLE 3

| Compound No. | Amount of blind over edging | Amount of dimensional change (T-top) by allowing to stand in HMDS |
|---|---|---|
| <1> | 0.03 | 0.03 |
| <2> | 0.02 | 0.04 |
| <3> | 0.02 | 0.05 |
| <4> | 0.02 | 0.05 |
| <5> | 0.02 | 0.05 |
| <6> | 0.02 | 0.04 |
| <7> | 0.02 | 0.03 |
| <8> | 0.03 | 0.04 |

TABLE 4

| Compound No. | Amount of blind over edging | Amount of dimensional change (T-top) by allowing to stand in HMDS |
|---|---|---|
| <9> | 0.03 | 0.04 |
| 10 | 0.03 | 0.03 |
| 11 | 0.05 | 0.05 |
| 12 | 0.04 | 0.05 |
| 13 | 0.04 | 0.05 |
| <8> + 12 | 0.04 | 0.04 |
| <4> + 12 | 0.04 | 0.04 |
| — | Bottoms are joined. | joined |

From Tables 3 and 4, it becomes apparent that when the aliphatic amine or the aliphatic amine salt was not added, the blind over edging was elongated so that the bottoms between the resist patterns were joined, and that with respect to the T-top, the roof-like irregular portions occurring on the heads of the resist patterns were joined, making it impossible to obtain a desired pattern shape. Meanwhile, according to the present invention, the irregularity of the shape such as a blind over edging or an undercut could be eliminated much.

In the case of using the compounds <1>, <7>, <8>, <9> and 10 as an aliphatic amine or an aliphatic amine salt, the resistance to dry etching was improved by 5%.

When the amount was increased, the sensitivity was notably decreased. When using the maximum amount of 1% by weight, the sensitivity was decreased by 10 times.

According to this Example, the chemical amplification-type positive photosensitive composition having the excellent resistance to environment and the excellent substrate resistance could be provided. When the polycyclic compound was utilized, the resistance to dry etching could be improved. The use of the above-mentioned materials can omit or simplify a cleaning treatment (for example, a treatment with a filter) of an environment. The omission or simplification of the treatment of the substrate poses no problem. That is, even though such a treatment is omitted or simplified, a resist process that gives an excellent dimensional precision and does not induce abnormality in the sectional shape, such as a T-top or a blind over edging can be realized.

Example 3

A chemical amplification-type negative resist was formed by adding 20% by weight of hexamethoxymethylmelamine (HMMM) as a bridging agent and 5% by weight of tris-trichloromethyl-s-triazine as a photosensitive acid generator to polyhydroxystyrene (PHS, molecular weight 4,000). This trichloromethyl-s-triazine as a photosensitive acid generator is the above-mentioned compound 4-2 with $R=CCl_3$.

A bare silicon substrate was used for reference as in Example 1. A silicon substrate having a titanium nitride (TiN) film thereon was used as a substrate which was liable to cause blinding over edging or undercutting. Specifically, it was a silicon substrate on which a TiN film having a size of 300 Å had been laminated. Since the product was a negative resist, the undercut (which occurred on both sides) on the lower portion of the resist was evaluated in terms of the length ($\mu$m) of the undercut on one side (length indicated at L2 in FIG. 2).

In the test for environmental atmosphere, the product was allowed to stand in a desiccator filled with hexamethyldisilazane (HMDS) for 1 minute as in Example 1. Since the product was a negative resist, rounding (which occurred on both sides) on the upper portion of the resist was evaluated in terms of the length ($\mu$m) of the rounding on one side (length indicated at L4 in FIG. 1).

The exposure and the development were conducted under the above-mentioned conditions using the above-mentioned negative resist containing an aliphatic amine or an aliphatic amine salt and the negative resist not containing the same (for comparison). The shapes of the resulting resists were then compared. The type of the aliphatic amine or the aliphatic amine salt and the results are shown in Tables 5 and 6. The amount of the aliphatic amine or the aliphatic amine salt was 0.5% by weight.

Separately, the test was conducted using 0.1% by weight of the aliphatic amine or the aliphatic amine salt, and the results were approximately the same as those provided by using 0.5% by weight thereof. However, when the amount was 0.01% by weight, the undercut intended to increase slightly.

TABLE 5

| Compound No. | Amount of undercut | Amount of dimensional change (rounding) by allowing to stand in HMDS |
|---|---|---|
| <1> | −0.02 | −0.01 |
| <2> | −0.01 | 0 |
| <3> | −0.02 | 0 |
| <4> | −0.01 | 0 |
| <5> | −0.01 | 0 |
| <6> | −0.01 | 0 |
| <7> | −0.02 | −0.01 |
| <8> | −0.02 | −0.01 |

TABLE 6

| Compound No. | Amount of undercut | Amount of dimensional change (rounding) by allowing to stand in HMDS |
|---|---|---|
| <9> | −0.02 | −0.01 |
| 10 | −0.02 | −0.01 |
| 11 | −0.01 | −0.01 |
| 12 | −0.01 | −0.01 |
| 13 | −0.02 | −0.01 |
| <8> + 12 | −0.02 | 0 |
| <4> + 12 | −0.02 | 0 |
| — | Bottom was undercut and the resist fell. | The head was rounded. |

Tables 5 and 6, it becomes apparent that when the aliphatic amine or the aliphatic amine salt was not added, the bottom of the resist pattern was undercut so that the resist pattern fell, and that with respect to the rounding, the head of the resist was notably rounded, making it impossible to obtain a desired pattern shape. Meanwhile, according to the present invention, the irregularity of the shape such as undercut of the bottom of the resist pattern or the rounding of the head thereof could be eliminated much.

In the case of using the compounds <1>, <7>, <8>, <9> and 10 as an aliphatic amine or an aliphatic amine salt, the resistance to dry etching was improved by 5%.

When the amount was increased, the sensitivity was notably decreased. When using the maximum amount of 1% by weight, the sensitivity was decreased by 10 times.

According to this Example, the chemical amplification-type negative photosensitive composition having the excellent resistance to environment and the excellent substrate resistance could be provided. When the polycyclic compound was utilized, the resistance to dry etching could be improved. The use of the above-mentioned materials can omit or simplify a cleaning treatment (for example, a treatment with a filter) of an environment. The omission or simplification of the treatment of the substrate poses no problem. That is, even though such a treatment is omitted or simplified, a resist process that gives an excellent dimensional precision and does not induce abnormality in the sectional shape, such as the bottom undercut or the head rounding in the sectional shape can be provided.

Example 4

This example is a modification of Example 1. A two-component chemical amplification-type positive resist was formed as in Example 1 using polyhydroxystyrene (PHS, molecular weight 10,000) in which 30% of a phenolic hydroxyl group was protected with tert-BOC—$CH_2$

[protective group (5)], THP [protective group (3)], i-PrOCO [protective group (2)], (CH₃)₃—Si— [protective group (4)] or an ethylvinyl ether group instead of tert-BOC [protective group (1)], and 0.5% by weight of each of triphenyl phosphotrifurate (compound 1-1 with n=3 and X=CF₃SO₃) as in Example 1, compounds 2-1, 3-1 to 3-4, 4-1 to 4-3 and 5-1 to 5-3. The subsequent procedures were conducted as in Example 1. Consequently, approximately the same results as in Example 1 were provided with respect to the effect of adding the aliphatic amine or the aliphatic amine salt.

Example 5

This is a modification of Example 2. A three-component chemical amplification-type positive resist was formed as in Example 2 using unprotected polyhydroxystyrene (PHS, molecular weight 12,000), the same photosensitive acid generator as that used in Example 4, and cholesterol having a hydroxyl group protected with tert-BOC instead of bisphenol A having the hydroxyl group protected with tert-BOC. The subsequent procedures were conducted as in Example 1. Consequently, approximately the same results as in Example 1 were provided with respect to the effect of adding the aliphatic amine or the aliphatic amine salt.

Example 6

This is also a modification of Example 2. A three-component chemical amplification-type positive resist was formed as in Example 2 using unprotected polyhydroxystyrene (PHS, molecular weight 12,000), the same photosensitive acid generator as that used in Example 4, and an N—O-acetal derivative as a dissolution inhibitor. The subsequent procedures were conducted as in Example 2. Consequently, approximately the same results as in Example 1 were provided with respect to the effect of adding the aliphatic amine or the aliphatic amine salt.

What is claimed is:

1. A photosensitive composition comprising:
   (a) a photosensitive acid generator;
   (b) a polyhydroxy-functional resin component wherein at least some of the hydroxyl groups are protected by acid sensitive removable protective groups; and
   (c) from about 0.01% to about 1.0% by weight based upon the overall photosensitive composition of an aliphatic amine selected from the group consisting of: 2-amino-2-methyl-1,3-propanediol; 2-amino-2-ethyl-1,3-propanediol; 6-amino-2-ethyl-1-hexanol; 2-amino-2-hydroxymethyl-1,3-propanediol; and 2-amino-2-methyl-1-propanol; 2-aminocyclohexanol hydrochloride; 3-aminonoradamantane; 3-aminonoradamantane hydrochloride; 2-aminoadamantane; 1-aminoadamantane; 2-aminonorbornene hydrochloride; 1-(3-aminopropyl)-2-pipecoline; and 1-(3-aminopropyl)-2-pyrrolidinone.

2. A photosensitive composition as defined in claim 1, wherein said poly hydroxy-functional resin comprises a poly(hydroxystyrene) resin.

3. A photosensitive composition as defined in claim 1, wherein said polyhydroxy-functional resin component comprises a poly(hydroxystyrene) resin having a molecular weight of about 10,000.

4. A photosensitive composition as defined in claim 1, wherein said polyhydroxy-functional resin component comprises a poly(hydroxystyrene) resin having a molecular weight of about 10,000 and having 30 mol % of its hydroxy styrene units protective with the acid sensitive removable protected groups.

5. A photosensitive composition as defined in claim 1, wherein the acid sensitive removable protective group comprises a reaction product of a said hydroxyl group with a tertiary-butylcarboxy group, an isopropylcarboxy group, a tetrahydropyranyl group, a trimethylsilyl group or a tertiary-butylcarboxymethyl group.

6. A photosensitive composition as defined in claim 1, wherein the photosensitive acid generator comprises an onium salt.

7. A photosensitive composition as defined in claim 1, further comprising a dissolution inhibitor.

8. A photosensitive composition as defined in claim 1, further comprising a dissolution inhibitor selected from the group consisting of: bisphenol A having a protected hydroxyl group; cholesterol having a protected hydroxy group; and an N—O-acetal derivative.

9. A photosensitive composition as defined in claim 1, wherein said photosensitive acid generator is selected from the group consisting of: 2,4,6-tris(trichloromethyl)-s-triazine, $C_6H_4(CCl_3)_2$ and $C_6H_4(CBr_3)_2$.

10. A photosensitive composition comprising:
    (a) a photosensitive acid generator;
    (b) a polyhydroxy-functional resin component;
    (c) a bridging agent; and
    (d) from about 0.01% to about 1.0% by weight based upon the overall photosensitive composition of an aliphatic amine selected from the group consisting of: 2-amino-2-methyl-1,3-propanediol; 2-amino-2-ethyl-1,3-propanediol; 6-amino-2-ethyl-1-hexanol; 2-amino-2-hydroxymethyl-1,3-propanediol; and 2-amino-2-methyl-1-propanol; 2-aminocyclohexanol hydrochloride; 3-aminonoradamantane; 3-aminonoradamantane hydrochloride; 2-aminoadamantane; 1-aminoadamantane; 2-aminonorbornene hydrochloride; 1-(3-aminopropyl)-2-pipecoline; and 1-(3-aminopropyl)-2-pyrrolidinone.

11. A photosensitive composition as defined in claim 10, wherein said bridging agent component (c) comprises hexamethoxymethylmelamine.

12. A photosensitive composition as defined in claim 10, wherein said poly hydroxy-functional resin comprises a poly(hydroxystyrene) resin.

13. A photosensitive composition as defined in claim 10, wherein said polyhydroxy-functional resin component comprises a poly(hydroxystyrene) resin having a molecular weight of about 10,000.

14. A photosensitive composition as defined in claim 10, wherein said polyhydroxy-functional resin component comprises a poly(hydroxystyrene) resin having a molecular weight of about 10,000 and having 30 mol % of its hydroxy styrene units protected with the acid sensitive removable protective groups.

15. A photosensitive composition as defined in claim 10, wherein the acid sensitive removable protective group comprises a reaction product of a said hydroxyl group with a tertiary-butylcarboxy group, an isopropylcarboxy group, a tetrahydropyranyl group, a trimethylsilyl group or a tertiary-butylcarboxymethyl group.

16. A photosensitive composition as defined in claim 10, wherein the photosensitive acid generator comprises an onium salt.

17. A photosensitive composition as defined in claim 10, further comprising a dissolution inhibitor.

18. A photosensitive composition as defined in claim 10, further comprising a dissolution inhibitor selected from the group consisting of: bisphenol A having a protected hydroxyl group; cholesterol having a protected hydroxy group; and an N—O-acetal derivative.

19. A photosensitive composition as defined in claim 10, wherein said photosensitive acid generator is selected from the group consisting of: 2,4,6-tris(trichloromethyl)-s-triazine, $C_6H_4(CCl_3)_2$ and $C_6H_4(CBr_3)_2$.

* * * * *